United States Patent [19]

Akinc et al.

[11] Patent Number: 4,906,608

[45] Date of Patent: Mar. 6, 1990

[54] METHOD FOR PREPARING SUPERCONDUCTORS CERAMIC COMPOSITION

[75] Inventors: Mufit Akinc; Ahmet Celikkaya, both of Ames, Iowa

[73] Assignee: Iowa State University Research Foundation, Ames, Iowa

[21] Appl. No.: 136,102

[22] Filed: Dec. 28, 1987

[51] Int. Cl.⁴ .............................................. C04B 35/51
[52] U.S. Cl. ........................................ 505/1; 501/152; 252/521

[58] Field of Search ............................. 505/1; 501/152; 252/521

[56] References Cited

FOREIGN PATENT DOCUMENTS

WO88/10009 12/1988 PCT Int'l Appl. ..................... 505/1

Primary Examiner—Mark L. Bell
Attorney, Agent, or Firm—Zarley McKee, Thomte, Voorhees & Sease

[57] ABSTRACT

A process of forming superconductor ceramic oxides from a melt of barium hydroxide and a copper salt selected from copper nitrate and copper acetate.

17 Claims, No Drawings

METHOD FOR PREPARING SUPERCONDUCTORS CERAMIC COMPOSITION

GRANT REFERENCE

This invention was made with Government support under Contract No. W-7405-ENG82 awarded by the Department of Energy. The Government has certain rights in the invention.

BACKGROUND OF THE INVENTION

The revolutionary discovery by Chu and his collaborators of superconductivity at about 90° K. in the yttrium, barium, copper oxide system has led to intense research efforts to prepare, characterize and fabricate a variety of related materials for possible future applications.

This invention relates to superconductive metal oxide ceramics, in particular to $YB\delta_2Cu_3O_x$, wherein x equals from 6.5 to 7.2.

The technology of superconductivity, particularly metal oxide ceramics which conduct electricity with no resistance at temperatures above the boiling point of liquid nitrogen, unlike previously known materials that can superconduct only near absolute zero, has been rapidly developing. These materials, i.e. certain metal-oxide ceramics, can conduct electricity with no resistance at temperatures above the boiling point of liquid nitrogen (77° K. or −196° C.). The discovery of these materials has been quite recent, and the demand for practical application of these materials will be ever increasing in the future. In particular, it is desirable to develop these new metal-oxide ceramics, particularly $YBa_2Cu_3O_x$, wherein x equals from 6.5 to 7.2 into useful conductor shapes such as wires, films, or thin sheets.

The superconducting phase in the yttrium barium copper oxide system has been determined to have the composition $YBa_2Cu_3O_{9-\delta}$ (where $\delta=2.1\pm0.05$). This material exhibits tetragonal symmetry at high temperature but transforms to orthorhombic symmetry when cooled slowly in oxygen atmosphere. It has been shown that superconducting phase is this orthorhombic phase.

The most common method for preparing this composition has involved mixing yttrium oxide ($Y_2O_3$) copper oxide (CuO) and barium carbonate ($BaCO_3$) followed by heating to about 750° C. to 1000° C. for times ranging between 6 to 16 hours, in a static air or flowing oxygen atmosphere, with several intermediate grindings or ball millings to facilitate a reaction between these starting materials to form the desired ceramic composition. This method of solid state reaction of the oxides and carbonates has been utilized by many investigators in the synthesis of $YBa_2Cu_3O_{9-\delta}$.

Although solid state reactions result in the superconducting phase; the method has several shortcomings. Generally the product contains a mixture of phases, may even contain chemical impurities introduced during the intermediate grinding or ball milling operations, and finally it is a rather tedious and time consuming method. One of the serious problems in the method described above is the slow decomposition of $BaCO_3$ which results in formation of barium deficient oxide phases rather than pure superconducting phase. Also, the elimination of residual carbonates is difficult.

Precipitation of the cations of yttrium, barium and copper in the proper ratio as oxalates and carbonates followed by a high temperature heat treatment to decompose into corresponding oxide has also been the subject of experiments but no significant improvement in the process was apparent as the oxalates and carbonates do not decompose readily and completely to yield pure, single phase superconducting oxide.

Accordingly, from the foregoing discussion it can be seen that there is a need for a new method for preparing a chemically pure and preferably single phase superconducting oxide material having yttrium, barium and copper oxides in the proper ratio in order to form a superconducting ceramic.

In particular, there is a need for a new method which avoids the solid state (particularly carbonate) reaction phases of the prior art, but which at the same time does not involve significant solution phases which must be boiled, evaporated, etc. In short, there is a need to have a technique for preparation of superconductor ceramics which does not use a slow, solid phase reaction and which avoids the cost ineffective problems of solution reactions wherein large amounts of water are employed.

Another primary objective of the present invention is to develop a method of preparing yttrium, barium and copper oxide superconductor ceramics which have the right stoichiometry, wherein the process is cost effective, and wherein the process is amenable to a large scale production with the reaction occurring in a single phase melt.

SUMMARY OF THE INVENTION

A new method for preparing superconducting oxide materials is disclosed. The method is based upon the discovery that one can form a melt of certain salts, oxides and hydroxides of yttrium, barium and copper at relatively low temperatures to form a homogeneous mixture followed by drying and calcining to form the superconducting oxide composition. The particular salts used to form the melt are copper nitrate, or copper acetate and barium hydroxide.

DETAILED DESCRIPTION OF THE INVENTION

The basic discovery of the present invention relies in the use of low temperature melting hydroxide of barium, and salts of copper, particularly using barium hydroxide and the use of either copper nitrate or copper acetate. Barium hydroxide ($Ba(OH)_2 8H_2O$) with a melting point of 78° C. and copper nitrate ($Cu(NO_3)_2\cdot 2.5\text{-}H_2O$) or copper acetate ($Cu(CH_3COO)_2$) with a melting point of about 115° C. were chosen and proved satisfactory. As for the yttrium source, either an aqueous solution of yttrium or a finely pulverized yttrium salt such as yttrium hydroxide or oxide can be used.

Generally the procedure can be summarized as follows, although more detail will be given below. Appropriate quantities of barium hydroxide, copper salt and a yttrium source salts such as hydroxide or oxide are weighed to yield Y:Ba:Cu cation ratio of 1:2:3. The hydroxide of barium and the salts of copper are placed, for example, in a glass beaker and heated to about 115° C. which forms a homogeneous liquid melt. A salt of yttrium is then added to this melt slowly with stirring to produce a homogeneous mixture. Depending on the type of salt used and temperature, the mixture has a consistency between a liquid and a thick paste. This material is then heated first to dryness in a static air oven at, for example, about 110° C. for overnight to form a precursor cake. The precursor cake is ground and further heat treated in air at temperatures ranging between about 750° C. to about 950° C. for up to 24 hours to form the oxide material. Each of the steps generally referred to above will now be described in some considerable detail.

In accordance with the first step of this process, a copper salt in solid form selected from copper nitrate and and heated to a temperature of at least 100° C. to about 120° C., preferably from about 115° C. to about 120° C. The temperature should be within the general area of about 115° C. since this is a high enough temperature to melt both solid phase copper nitrate and solid phase copper acetate, and also easily melt solid phase barium hydroxide which has a melting point of 78° C. The copper salts and barium hydroxide may be heated sequentially or they may be mixed together and heated. When mixed together and heated, there may be some eutectic effect which allows the temperature to be as low as about 100° C.

After the copper salts and barium hydroxide are melted together and mixed in this first step, an aqueous solution of the yttrium source such as the salt, hydroxide or oxide is then added in a second step. Preferably the yttrium salt is concentrated and best results have been found with from 0.5 molar to 3 molar yttrium nitrate, most preferably 2 molar, although any water soluble yttrium source may be used. This is added to the melt slowly with stirring to produce a homogeneous mixture.

In this second step it may also be possible to add a solid powder form of the yttrium source and form a continuous phase with the melt of the copper salt and barium hydroxide, although it has been found more process efficient if one adds the yttrium salt in a concentrated aqueous solution as referred to above. The addition is slow with constant stirring to provide homogeneity. Generally, this takes from about 30 seconds to about 5 minutes for a small batch phase. Incidentally, it goes without saying that this process has the capability of being started up and run in either batch phase or continuous phase at the process operator's choice.

While it has been referred to above that one may add yttrium nitrate, or any other water soluble aqueous salt of yttrium, it is also possible that one can add either yttrium hydroxide or oxide.

In the next step of the process, the liquid melt phase now containing yttrium ions, copper ions and barium ions all in the proper molar ratio to provide the desired ceramic oxide is heated to dryness by a temperature that is high enough to drive off the moisture that is present. Preferably this can be done in static air at a temperature of about 110° C. overnight to form a precursor cake.

In the next step, the precursor cake is ground in order to increase its surface area. This grinding step is optional.

Next, the ground or subdivided precursor cake is calcined at a temperature between about 750° C. and about 1000° C., preferably from about 750° C. to about 950° C. for a time of about 24 hours, but at least for sufficient time to thermally convert the ground precursor cake to the desired oxide. This may be done in the presence of air or in the presence of an oxygen atmosphere.

After calcining, the ceramic is cooled slowly to form the single phase crystals of superconductor, preferably in an oxygen atmosphere but satisfactory results are also achieved in an air atmosphere.

Optionally, after the first two steps, i.e. melting followed by yttrium addition, the product appears as a paste and this paste may be smeared over a substrate and then directly charred to form a film which adheres to the substrate. This film can then be calcined to form the desired superconductor in a film form. It may also be possible that the paste formed after the solid phase melt could also be drawn into a wire.

The key steps of this invention, as illustrated by the examples before, are the first two steps which allow formation of a melt of proper stoichiometrics in a liquid phase without needing to add huge amounts of water which ultimately must be driven off. In particular, it involves the selection of barium hydroxide and either copper acetate or copper nitrate as solid state salts to begin the process with, and the direct heating of those to form a liquid melt without going through the use of solutions. In this manner, the cations stoichiometry is easily controlled and it assures that they are present in the right proportions to form the desired crystals of $YBa_2Cu_3O_x$, wherein x equals from about 6.5 to about 7.2.

The following examples are offered to further illustrate but not limit the invention.

EXAMPLE 1

A 47.48 g of $Cu(NO_3)_2 \cdot 2.5H_2O$ and 42.93 g $Ba(OH)_2 \cdot 8H_2O$ were weighed and placed in a beaker. The beaker and its contents were heated over a hot-plate to form a homogeneous melt to which 34 ml of 2M $Y^{+3}$ nitrate aqueous solution was added slowly and with stirring. When all the yttrium solution was added the mixture slowly thickened to form a paste. This paste was then dried at 110° C. for overnight. The dried precursor cake was ground lightly to form a powder and calcined at 750° C. in air for 12 hours. After the calcination process, the color of the powder turned from green to black and was relatively free flowing powder, after a very light grinding. Although drying the paste and light grinding before the calcination is beneficial, it is not required and it has been successfully done without drying and grinding by direct calcining of the paste.

EXAMPLE 2

A similar procedure of Example 1 is followed except the aqueous solution of yttrium was replaced with 11.29 g monosize precursor powders of yttrium hydroxycarbonate $(Y(OH)CO_3 \cdot XH_2O)$.

EXAMPLE 3

This example was similar to the procedure followed in Example 1 but the aqueous solution of yttrium was replaced with 7.68 g fine powder of $Y_2O_3$.

EXAMPLE 4

The procedure was similar to Example 1 except the aqueous solution of yttrium nitrate was replaced with 9.59 g of fine powder of yttrium hydroxide which had been earlier synthesized in the laboratory.

EXAMPLE 5

The procedure was similar to Example 4 except $Cu(NO_3)_2 \cdot 2.5H_2O$ was then slowly added in solid form. The material formed a thick paste. From 50 to 75 ml water was added to this paste so that yttrium hydroxide could be mixed with the beaker contents easily. The resultant powder obtained following heat treatment was similar to ones obtained in other examples.

EXAMPLE 6

The procedure was similar to that in Example 5 except both salts (Ba(OH)$_2$ and Cu(NO$_3$)$_2$) were melted separately before mixing, and molten Ba(OH)$_2$ was added to molten Cu(NO$_3$)$_2$. The reaction mixture was thick but homogeneous.

EXAMPLE 7

This procedure was similar to that in Example 6 but the order of mixing was reversed. The viscosity of the mixture was very high that in addition of Y(OH)$_3$ powder to this mixture resulted in a non-homogeneous product, thus this procedure was deemed to be not as successful.

EXAMPLE 8

In this case yttrium hydroxide was replaced with an aqueous solution of yttrium in Examples 5, 6 and 7 which caused the mixing of the constituent easy and did not require any water addition.

EXAMPLE 9

The procedure was similar to that in Example 1 except Cu(NO$_3$)$_2$ was replaced with copper acetate Cu(CH$_3$COO)$_2$. Instead of forming a paste, the mixture of Ba(OH)$_2$ and Cu(CH$_3$COO)$_2$ formed a fluid with a relatively low viscosity. Even after addition of yttrium hydroxide the mixture was not thick. Viscosity of this mixture increases with time during this heating period.

It can be seen from the above examples that the invention accomplishes at least all of its stated objectives. In particular, the synthesized oxides have been shown by subsequent testing to have the desired formula: YBa$_2$Cu$_3$O$_x$ wherein x equals from 6.5 to about 7.2 and have been demonstrated by the traditional Meissner effect as having superconductivity.

Since the method is not sensitive to the form of yttrium source (that is can be added in the form of aqueous solution of salt as well as hydroxide or oxide powders) the method should give satisfactory results by replacing yttrium with elements having similar ionic size, in particular rare earths.

What is claimed is:

1. A process of forming a superconductor ceramic of the formula: YBa$_2$Cu$_3$O$_x$ wherein x is from about 6.5 to about 7.2, said process comprising:
   (a) heating a solid phase copper salt selected from the group of copper acetate and copper nitrate and solid phase barium hydroxide to a temperature high enough to form a melt-phase; and
   (b) adding to the melt a salt, hydroxide or oxide as a source of yttrium with stirring to provide a substantially homogeneous mixture, the quantities of each of said copper salt, barium hydroxide and yttrium source being sufficient to yield a Y:Ba:Cu ratio of about 1:2:3; and thereafter
   (c) calcining the substantially homogeneous mixture at temperatures of from about 750° C. to about 1000° C. to form said superconductor ceramic.

2. The process of claim 1 wherein the heating of the copper source and the barium source of step (a) is done sequentially.

3. The process of claim 1 wherein the heating of step (a) of the copper source and the barium source to melt phase is done simultaneously.

4. The process of claim 1 wherein the copper salt is the nitrate.

5. The process of claim 1 wherein the copper salt is the acetate.

6. The process of claim 1 wherein the heating of step (a) is at a temperature from about 100° C. to about 120° C.

7. The process of claim 1 wherein the heating of step (a) is at a temperature from about 115° C. to about 120° C.

8. The process of claim 1 wherein the yttrium source is a concentrated aqueous solution of a salt, hydroxide or oxide of yttrium.

9. The process of claim 8 wherein the yttrium source is a yttrium nitrate salt.

10. The process of claim 9 wherein the concentration of the yttrium salt is from about 0.5 molar to about 3 molar.

11. The process of claim 10 wherein the concentration of the yttrium salt is about 2 molar.

12. The process of claim 1 wherein an additional step after step (b) and before step (c) heating the product of step (b) to dryness to form a precursor cake which is thereafter ground.

13. The process of claim 1 wherein an additional step after calcining, step (c), includes a slow cooling step.

14. The process of claim 13 wherein the slow cooling is down to a temperature of at least 550° C. at a rate of about 3° C./min.

15. The process of claim 14 wherein additional cooling occurs to room temperature at a rate of about 5° C./min.

16. The process of claim 14 wherein the cooling occurs in an oxygen atmosphere.

17. The process of claim 14 wherein the cooling occurs in an air atmosphere.

* * * * *